United States Patent
Maeda

(10) Patent No.: US 6,326,558 B1
(45) Date of Patent: Dec. 4, 2001

(54) PART HOLDER AND ELECTRONIC EQUIPMENT USING SAME

(75) Inventor: Osamu Maeda, Osaka (JP)

(73) Assignee: Funai Electro Co., Ltd., Osaka (JP)

( * ) Notice: Subject to any disclaimer, the term of this patent is extended or adjusted under 35 U.S.C. 154(b) by 0 days.

(21) Appl. No.: 09/354,748

(22) Filed: Jul. 29, 1999

(30) Foreign Application Priority Data

Aug. 6, 1998 (JP) .................................................. 10-005965

(51) Int. Cl.⁷ .............................. H05K 1/16; H01B 17/00
(52) U.S. Cl. .................. 174/260; 174/52.1; 174/138 G; 174/250; 361/760; 361/807; 361/809
(58) Field of Search ..................................... 174/260, 250, 174/138 G, 52.1, 262; 361/760, 807, 808, 809, 810, 811, 812

(56) References Cited

U.S. PATENT DOCUMENTS

| | | | |
|---|---|---|---|
| 4,611,868 | * 9/1986 | Matsui et al. | 439/590 |
| 4,796,158 | * 1/1989 | Sim | 361/807 |
| 5,037,309 | * 8/1991 | Abe et al. | 439/56 |
| 5,117,330 | * 5/1992 | Miazga | 361/760 |
| 5,246,157 | * 9/1993 | Siegel | 228/55 |
| 5,251,087 | * 10/1993 | Sakashita et al. | 341/15 |
| 5,590,029 | * 12/1996 | Estes | 361/760 |
| 5,920,463 | * 7/1999 | Thomas et al. | 361/760 |
| 6,013,133 | * 1/2000 | Takashima et al. | 118/500 |

FOREIGN PATENT DOCUMENTS

406260737 * 9/1994 (JP) .
407212058 * 8/1995 (JP) .

* cited by examiner

Primary Examiner—Jeffrey Gaffin
Assistant Examiner—I B Patel
(74) Attorney, Agent, or Firm—Lackenbach Siegel

(57) ABSTRACT

A part holder includes a part holding portion. In this part holding portion, a leadless part is held by a part receiving portion and an engaging piece. In such a state, the leadless part is inserted in a hole formed in a printed circuit board. At this time, a resilient piece provided on a leg of the part holder comes into abutment against an inner edge of the hole, whereby the part holder is fixed by the hole. Also, the part inserted in the hole is urged onto one surface of the hole by a resilient portion of the part holder. Thus, a pattern formed on one main surface of the part is closely contacted with a pattern formed on a backside of the printed circuit board.

18 Claims, 7 Drawing Sheets

PART HOLDER AND ELECTRONIC EQUIPMENT USING SAME

BACKGROUND OF THE INVENTION

1. Field of the Invention

This invention relates to part holders and printed circuit boards and, more particularly, to a part holder to insert and hold a leadless part in a hole formed, for example, in a printed circuit board, and a printed circuit board using same.

2. Description of the Prior Art

It has been conventionally considered to use leadless parts in mounting on a printed circuit board because the use of leaded parts makes the process complicate.

Meanwhile, there are methods as prior arts to directly mount a substrate in a way different from the present method, as disclosed in Japanese Patent Laying-open No. S64-84787 [H05K 1/14] laid open to the public on Mar. 30, 1989, Japanese Utility Model Laying-open No. S63-136377 [H05K 1/14, 1/02, 7/14] laid open on Sep. 7, 1988, Japanese Utility Model Laying-open No. S61-134075 [H05K 1/14] laid open on Aug. 21, 1986, and Japanese Utility Model Laying-open No. S60-45465 [H05K 3/36, 1/14] laid open on Mar. 30, 1985.

However, if leadless parts are directly inserted in the holes formed in a printed circuit board, a problem is encountered that the leadless part cannot be fix in the hole due to variation in size of the holes. That is, if the leadless part is not fixed in the hole, the leadless part is positioned with inclination. This might cause disconnection of a pattern on the leadless part from a pattern on the printed circuit board, or floating of a leadless part upon dipping, resulting in poor soldering.

SUMMARY OF THE INVENTION

Therefore, it is a primary object of the present invention to provide a part holder which can fix a leadless part inserted in a hole formed in a printed circuit board.

It is another object of the present invention to provide a part holder which can positively solder between a leadless part and a printed circuit board by dipping. It is further object of the present invention to provide a printed circuit board having leadless parts soldered thereon by dipping.

A part holder according to the present invention is for inserting a leadless part in a hole formed in a printed circuit board, and comprises: a part holding portion for holding the leadless part; two legs integrated with the part holding portion and to be inserted in the hole; and a resilient portion formed between the two legs and urging the leadless part, in the hole, onto one surface of the hole.

The leadless part is held, for example, by the projection provided in the part holding portion of the part holder. The two legs of the part holder are inserted in a hole formed in a printed circuit board. At this time, because the resilient portion provided on the leg forces against an inner edge in one way, the part holderv is fixed in the hole.

According to the present invention, a part inserted in a hole can be positively fixed regardless of variation in size of holes formed in a printed circuit board or leadless part. Consequently, the both can be positively soldered by dipping.

In one aspect of the present invention, the part holding portion includes a receiving portion to receive one main surface of the leadless part, and an engaging portion to engage the leadless part received on the receiving portion. Thus, the leadless part can be fixedly held on the part holding portion.

In another aspect of the present invention, the leadless part has a support hole, and the part holding portion has a projection to be engaged with the support hole. If the leadless part is attached to the part holding portion such that the projection engages with the support hole, the leadless part is fixedly held on the holding portion.

In further aspect of the present invention, the leg includes a resilient piece to be abutted against an inner surface of the hole. Due to this, the part holder is fixed in the hole.

In one embodiment of the present invention, the resilient piece is a spring utilizing flexion of a resin forming mold.

In still another aspect of the present invention, the leg includes a removal preventing portion formed at a lower portion thereof. Due to this, if the part holder is once mounted on the printed circuit board, it will not be removed.

In another aspect of the present invention, a guard portion is formed at an upper end of the part holder. For example, during assembling the leadless part is prevented from being touched by a human hand.

If the above-structured part holder is mounted on the printed circuit board, a first pattern formed on one main surface of the leadless part is closely contacted with a second pattern formed on a backside of the printed circuit board. Because the part holder is structured not to cause positional deviation, the first pattern and the second pattern can be soldered to each other by dipping.

The above described objects and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
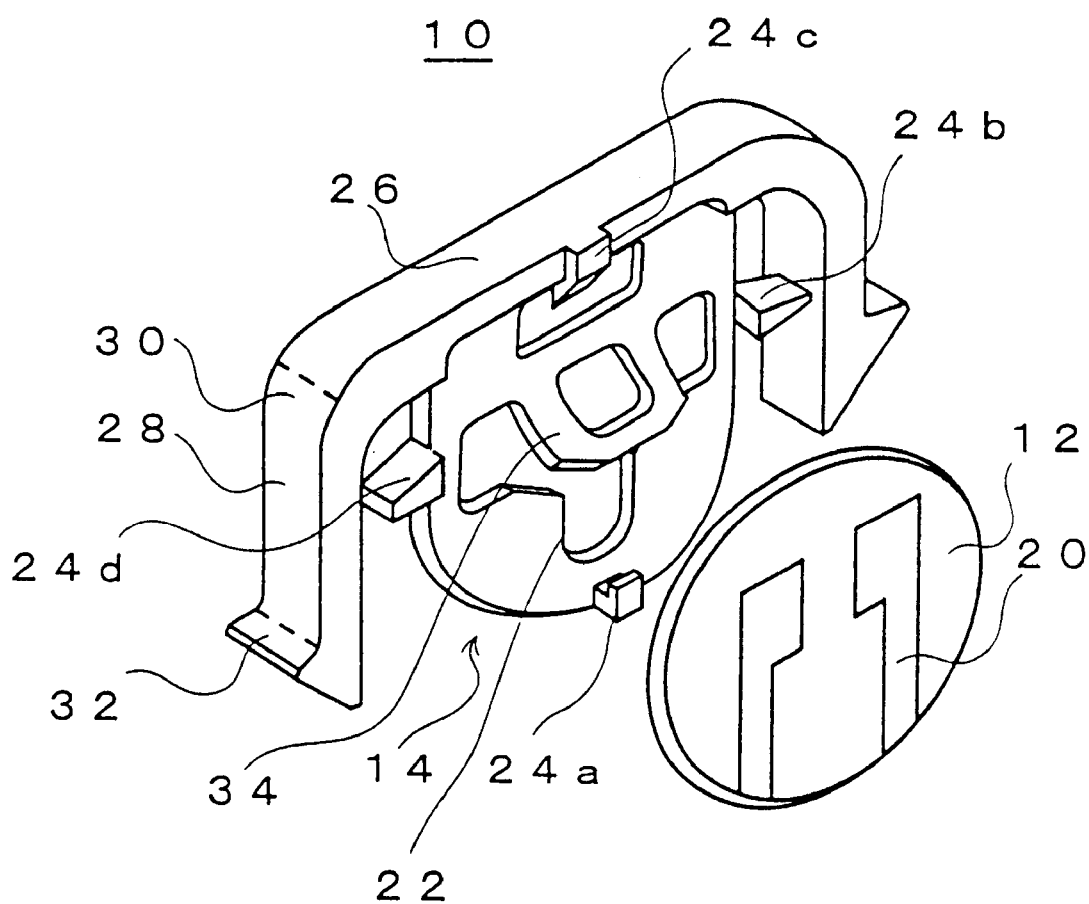
FIG. 1 is a perspective view of a part holder, as viewed from a front, according to an embodiment of the present invention.
Figure 3:
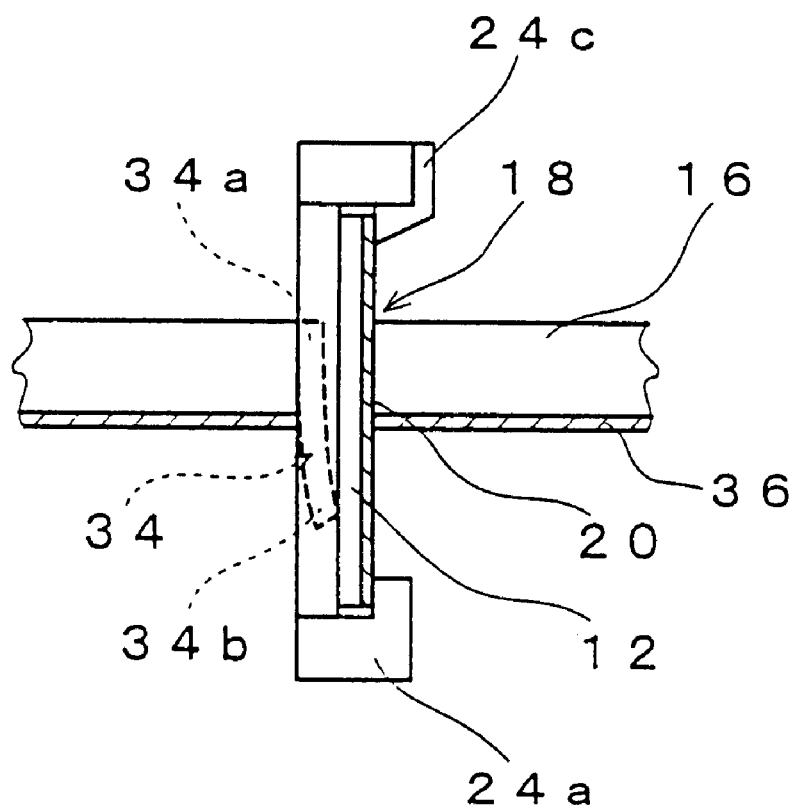
FIG. 3 is an illustrative view showing a state that a part is inserted in a hole of a printed circuit board using the part holder of FIG. 1 embodiment.

A part holder 10 of this embodiment, as shown in FIG. 1, is formed of a heat-resistive synthetic resin that is not readily deformed, for example, even at a temperature of approximately 250–260° C. to be experienced during dipping, and includes a part holding portion 14 to hold a leadless part (hereinafter referred merely to as "part") 12. The part 12 held in the part holding portion 14 is inserted, together with the part holder 10, in a hole 18 formed in a printed circuit board 16, as shown in FIG. 3. Incidentally, although the part 12 in this embodiment is a surge gap having a pattern 20 formed with spacing on a disc-formed ceramic base, the part 12 may use an arbitrary form or function.

Referring to FIG. 1, the part holding portion 14 has a shape and size adapted for a shape and size of the part 12. The part holding portion 14 is provided with a receiving portion 22 to receive, at a surface, one main surface of the part 12, and claw-like engaging pieces 24a, 24b, 24c and 24d formed at peripheral edge of the receiving portion 22. The engaging pieces 24a–24d engages with the part 12 received in the part receiving portion 22 at peripheral part thereof. Accordingly, the part 12 is fixedly held by the receiving portion 22 and the engaging pieces 24a–24d. In this case, the part holding portion 14 holds the part 12 in a state of exposing a pattern 20 formed on the other main surface of the part 12.

Above the part holding portion 14, a guard is formed extending at above the receiving portion 22. The guard portion 26 is for guarding the part 12 so that the part 12 held by the part holding portion 14 cannot be readily touched by a human hand. Two legs 28 are formed integral with this guard portion 26 and part holding portion 14, to extend downward from opposite ends of the guard portion 26. The legs 28 are inserted, together with the part holding portion 14, in a hole 18 formed in a printed circuit board 16.

The leg 28 has a resilient piece 30 projecting in a width direction of the part holder 10, similarly to the guard portion 26. The resilient piece 30 is to abut against an inner edge of the hole 18. That is, the part holder 10 is fixed in the hole 18 by abutting the resilient piece 30 against the inner edge of the hole 18. Also, the leg 28 is further provided with a removal preventing portion 32 formed in a side face of the resilient piece 30. The removal preventing portion 32 prevents the part holder 10 from being removed out of the hole 18 by abutting its upper surface against a backside of the printed circuit board 16.

Figure 2:
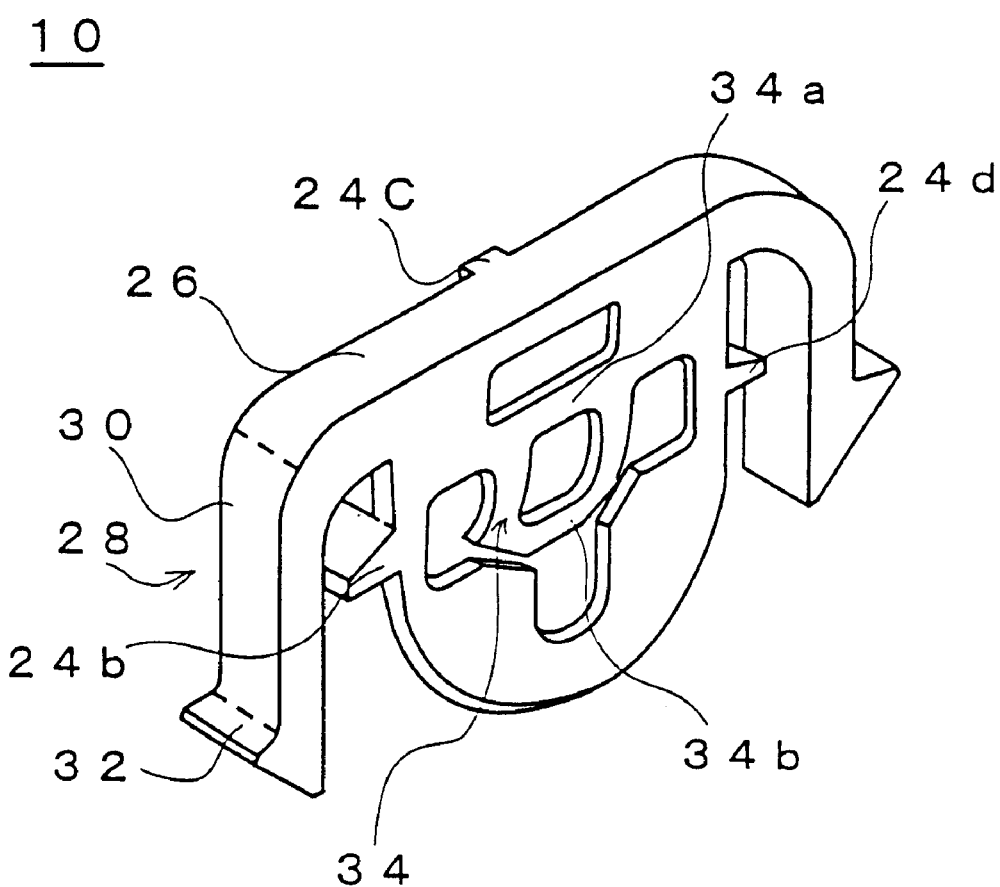
FIG. 2 is a perspective view of the part holder, as viewed from a back, of the FIG. 1 embodiment.

The part holder 10 further has a resilient portion 34 formed in a back of the part holder, i.e. in a same plane as the part receiving portion 22, as will be well understood from FIG. 2. The resilient portion 34 includes a base portion 34a in the same plane as a part receiving portion 22, and a free end 34 extending downward from the base portion 34a and curved toward a part 12 to be held in the receiving portion 22. The curved free end 34b forces a part 12 inserted in the hole 18 onto one inner surface of the hole 18, as shown in FIG. 3. Due to this, a first pattern 20 formed on the part 12 is closely contacted with a second pattern 36 formed on a backside of the printed circuit board 16. Consequently, the first pattern 20 and the second pattern 36 can be positively soldered to each other during dipping without causing positional deviation.

Figure 4:
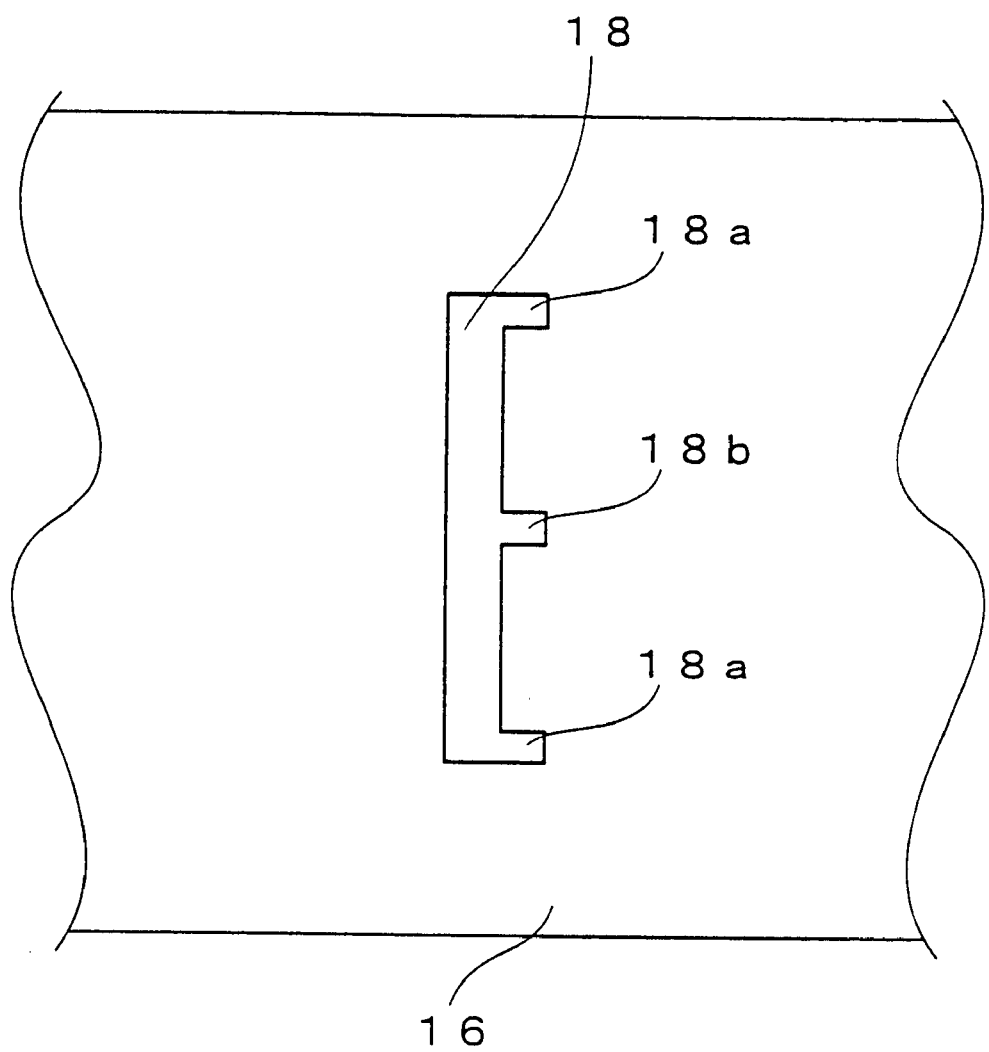
FIG. 4 is a view of the printed circuit board, as viewed from a top, of the FIG. 1 embodiment.

Incidentally, the hole 18 is formed with cut-outs 18a and 18b, as shown in FIG. 4. The cut-out 18a receives the legs 28, while the cut-out 18b receives the engaging piece 24a. That is, the formation of the cut-outs 18a and 18b can decrease the gap between the part 12 and the inner surface of the hole 18. The part 12 is positively abutted against the hole 18 inner surface by the above-mentioned free end 34b.

Figure 5:
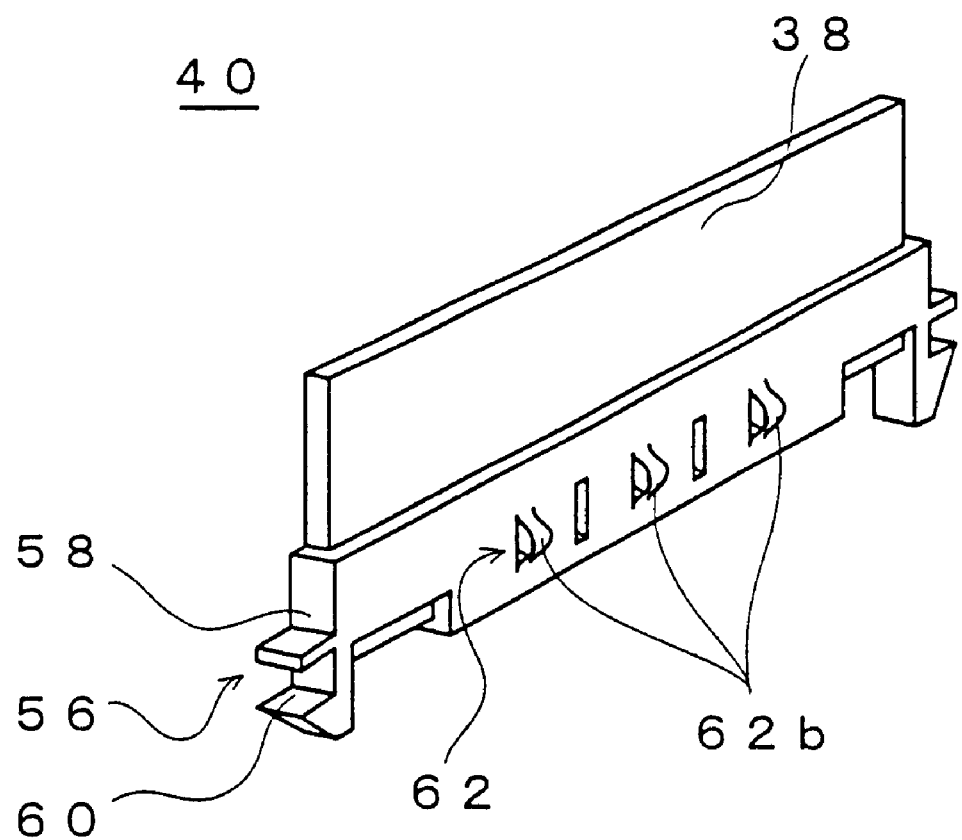
FIG. 5 is a perspective view of a part holder, as viewed from a front, according to another embodiment of the present invention.

FIG. 5 show a part holder 40 according to another embodiment. This part holder 40 holds a unit circuit board 38 to be mounted on a main circuit board 50 (FIG. 7), and inserted together with the unit circuit board 38 in the main circuit board 50. The unit circuit board 38 has upright-standing circuit parts mounted on one main surface thereof, and a pattern 42 formed on the other main surface which is to be connected to a pattern 68 of the main circuit board 50. The unit circuit board 38 has further support holes 48a, 48b and 48c so that projections 46a, 46b and 46c formed on the part holder 40 can be respectively inserted in the support holes 48a, 48b and 48c. The part holder 40 is further formed with a board support portion 44 positioned under the projections 46a–46c. This board support portion 44 receives an lower end face of the unit circuit board 38. By inserting the projections 46a–46c in the support holes 48a–48c, the unit circuit board 38 can be held in the part holder 40. Also, the part holder 40 is formed of a heat-resistive synthetic resin that is not readily deformed at a temperature to be experienced during dipping, similarly to the part holder 10 of the former embodiment.

That is, the part holder 40 has a shape and size adapted for a shape and size of the unit circuit board 38. The part holder 40 includes a receiving portion 54 having a surface to receive one main surface of the unit circuit board 38. The above-mentioned projections 46a–46c as well as the support portion 44 vertically rise from a surface of the receiving portion 54. The unit circuit board 38 is fixedly held by the part holder 40 with the projections 46a–46c engaged respectively with the support holes 48a–48c, in a state the unit circuit board 38 is rested at the one main surface on the receiving portion 54. At this time, the pattern 42 formed on the other main surface of the unit circuit board 38 is exposed outside.

Figure 7:
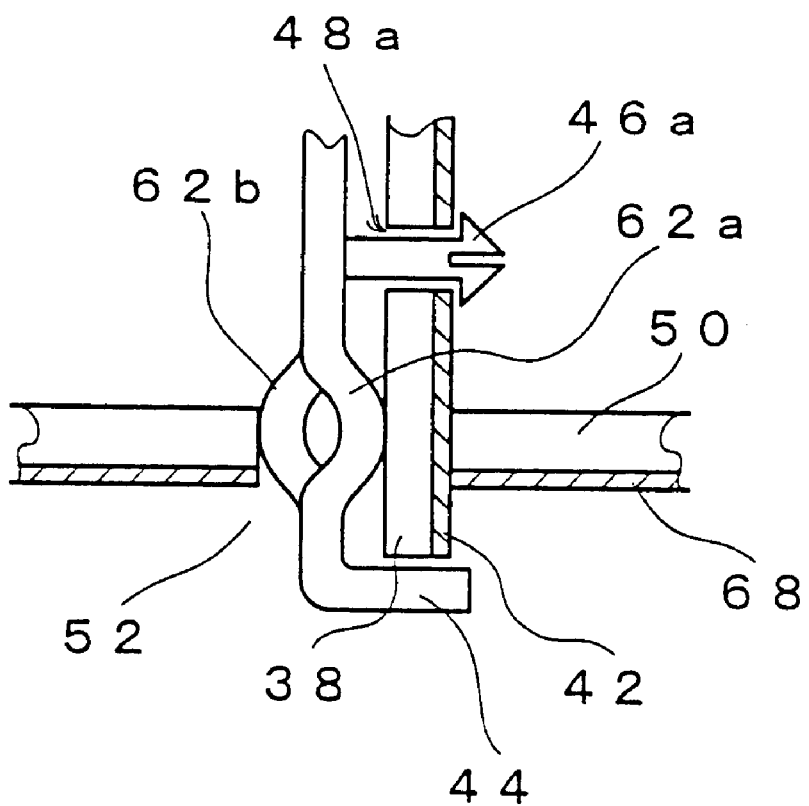
FIG. 7 is an illustrative view showing a state of insertion into a hole of a unit circuit board using part holder of the FIG. 4 embodiment.

Two legs 56 are formed extending downward from opposite ends of the receiving portion 54. The legs 56 are inserted in a hole 52 of a circuit board 50 (FIG. 7).

The leg 56 is provided with a resilient piece 58 projecting in a width direction of the part holder 40. The resilient piece 58 abuts against an inner edge of the hole 52. That is, the part holder 40 is fixed by the hole 52 by abutting the resilient piece 58 against the inner edge of the hole 52.

Also, the leg 56 is further provided with a removal preventing portion 60 formed in a side surface of the resilient piece 58. The removal preventing portion 60 at its upper surface abuts against a backside of the main circuit board 50, thereby preventing the part holder 40 from being removed out of the hole 52.

Figure 6:
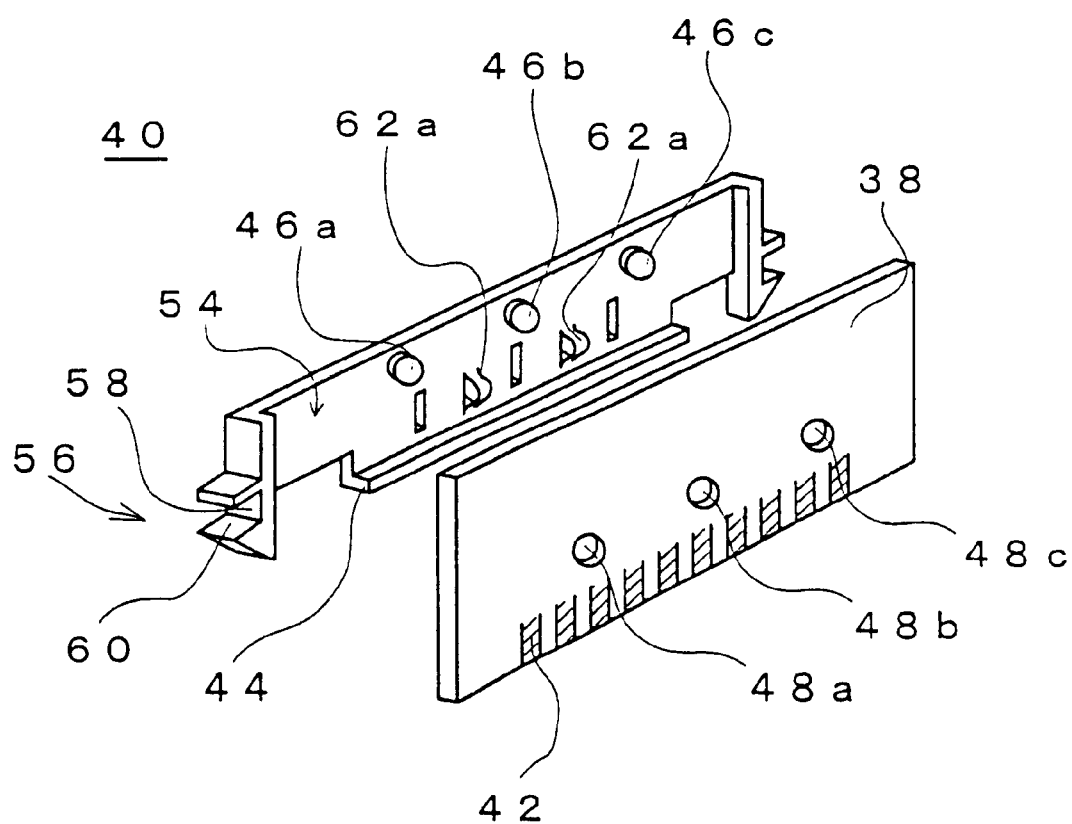
FIG. 6 is a perspective view of the part holder, as viewed from a back, of the FIG. 4 embodiment.

The part holder 40 further has resilient portion 62 formed by cut and rise in receiving portion 54, as will be well understood from FIG. 5 and FIG. 6. The resilient portion 62 includes a projection 62a that projects toward the receiving portion 54 and a projection 62b that projects toward the backside. As shown in FIG. 7, the resilient portion 62 urges the unit circuit board 38 inserted together with the part holder 40 in the hole 52 of the main circuit board 50 onto one inner surface of the hole 52. Accordingly, a pattern 42 formed on the unit circuit board 38 is brought into close contact with a pattern 68 formed on a backside of the main circuit board 50. Consequently, the pattern 42 and the pattern 68 during dipping are positively soldered to each other without incurring positional deviation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A part holder, comprising a leadless part formed with a part pattern on one main surface thereof for inserting in a hole formed in a printed circuit board formed with a board pattern on one main surface thereof, said holder comprising:

a part holding portion for holding said leadless part, said part holding portion holding said leadless part in a manner that said leadless part is held upright and said one main surface of said leadless part is exposed at one side surface of said part holder;

two legs integrated with said part holding portion and to be inserted in said hole, said legs being extended downwardly; and a resilient portion formed between said two legs and urging said leadless part, in said hole, against an inner surface of said hole, whereby said part pattern is close to said board pattern.

2. A part holder according to claim 1, wherein said part holding portion includes a receiving portion to receive one main surface of said leadless part, and an engaging portion to engage said leadless part received on said receiving portion.

3. A part holder according to claim 2, further comprising a guard portion formed at an upper end.

4. A part holder according to claim 1, wherein said leadless part has a support hole, and said part holding portion has a projection to be engaged with said support hole.

5. A part holder according to claim 4, further comprising a guard portion formed at an upper end.

6. A part holder according to claim 1, wherein said leg includes a resilient piece to be abutted against an inner surface of said hole.

7. A part holder according to claim 1, wherein said resilient portion is a spring utilizing flexion of a resin forming mold.

8. A part holder according to claim 1, wherein one said leg includes a removal preventing portion formed at a lower portion thereof.

9. A part holder according to claim 1, further comprising a guard portion formed at an upper end.

10. An electronic equipment comprising a printed circuit board, formed with a board pattern on one main surface thereof, and having a hole, a leadless part formed with a part pattern on one main surface thereof by using a part holder, said hole for mounting said leadless part, said part holder includes;

a part holding portion for holding said leadless part, said part holding portion holding said leadless part in a manner that said leadless part is held upright and said one main surface of said leadless part is exposed at one side surface of said part holder, two legs integrated with said part holding portion and to be inserted in said hole, said legs being extended downwardly;

a resilient portion formed between said two legs and urging said leadless part in said hole against an inner surface of said hole, whereby said part pattern is close to said board pattern, wherein said part pattern and said board pattern are soldered to each other.

11. An electronic equipment according to claim 10, wherein said part holding portion includes a receiving portion to receive said one main surface said leadless part, and an engaging portion to engage with said leadless part received on said receiving portion.

12. The electric equipment according to claim 11, wherein said leg includes a resilient piece to be abutted against an inner surface of said hole.

13. An electronic equipment according to claim 10, wherein said leadless part has a support hole, and said part holding portion having a projection to be engaged with said support hole.

14. The electronic equipment according to claim 13, wherein said leg includes a resilient piece to be abutted against an inner surface of said hole.

15. The electronic equipment according to claim 10, wherein one said leg includes a resilient portion to be abutted against an inner surface of said holes.

16. The electronic equipment according to claim 15, wherein one said resilient portion is a spring utilizing flexion of resin forming molding.

17. The electronic equipment according to claim 16, wherein said leg includes a removal preventing portion formed at a lower portion thereof.

18. The electronic equipment according to claim 15, wherein one said leg includes a removal preventing portion formed at a lower portion thereof.

* * * * *